(12) United States Patent
Blankenship

(10) Patent No.: US 12,265,495 B2
(45) Date of Patent: Apr. 1, 2025

(54) SIGNAL REFLECTION MITIGATION SYSTEMS

(71) Applicant: Hamilton Sundstrand Corporation, Charlotte, NC (US)

(72) Inventor: Dale Blankenship, Chandler, AZ (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 8 days.

(21) Appl. No.: 17/887,285

(22) Filed: Aug. 12, 2022

(65) Prior Publication Data

US 2024/0054089 A1 Feb. 15, 2024

(51) Int. Cl.
*G06F 13/40* (2006.01)
*H05K 1/02* (2006.01)

(52) U.S. Cl.
CPC ....... *G06F 13/4063* (2013.01); *H05K 1/0298* (2013.01)

(58) Field of Classification Search
CPC .......................... G06F 13/4063; H05K 1/0298
USPC .......................... 710/2–3, 300, 305; 361/760
See application file for complete search history.

(56) References Cited

U.S. PATENT DOCUMENTS

| | | | |
|---|---|---|---|
| 3,719,930 A * | 3/1973 | Horoshima | H04L 5/02 710/264 |
| 3,843,844 A * | 10/1974 | Schumperli | H04Q 3/00 379/382 |
| 4,368,523 A * | 1/1983 | Kawate | G02F 1/13624 345/206 |
| 4,860,166 A | 8/1989 | Nicholls | |
| 4,971,569 A | 11/1990 | Gooch et al. | |
| 5,347,177 A | 9/1994 | Lipp | |
| 5,438,297 A | 8/1995 | Rahal-Arabi et al. | |
| 5,757,249 A * | 5/1998 | Gabara | H04L 25/0298 370/452 |
| 6,978,328 B1 | 12/2005 | Osaka et al. | |
| 7,477,069 B2 | 1/2009 | Broyde et al. | |
| 10,115,050 B2 | 10/2018 | Gragnic et al. | |
| 2004/0088127 A1* | 5/2004 | M'Closkey | G01C 19/56 702/96 |
| 2010/0085110 A1* | 4/2010 | Jiao | G05F 1/46 327/536 |
| 2013/0128833 A1* | 5/2013 | Lee | H04W 52/545 370/329 |
| 2014/0207994 A1* | 7/2014 | Cherkaoui | H04L 12/42 710/312 |
| 2015/0179106 A1* | 6/2015 | Yoon | G09G 3/3233 345/77 |

(Continued)

OTHER PUBLICATIONS

Supplementary European Search Report dated Jan. 19, 2024 in connection with European Patent Application No. 23191175.1, 7 pages.

*Primary Examiner* — Farley Abad
*Assistant Examiner* — Henry W Yu

(57) ABSTRACT

A circuit can include a closed loop bus line having a plurality of connections. The circuit can include a plurality of integrated circuits disposed on the close loop bus line at a respective connection of the plurality of connections. One or more of the integrated circuits can be configured to drive a signal on the closed loop bus line. The closed loop bus line can be configured to prevent signal reflection. For example, in certain embodiments, there are no termination resistors at any of the terminations to reduce size, weight, and/or part count of the circuit.

22 Claims, 13 Drawing Sheets

(56) References Cited

U.S. PATENT DOCUMENTS

2021/0157697 A1\* 5/2021 Metcalf .................... G06F 1/30
2023/0324340 A1\* 10/2023 Beardslee ............ G01N 29/022
                                                      73/579

\* cited by examiner

SIGNAL REFLECTION MITIGATION SYSTEMS

FIELD

This disclosure relates to signal reflection mitigation systems.

BACKGROUND

When multiple Integrated Circuits (ICs) are connected together on a Printed Wiring Board (PWB), signal reflections occur at the physical ends of the copper trace (circuit). These reflections may result in voltage levels that exceed the minimum or maximum allowable input voltage of one or more of the ICs. Traditionally, these reflections are reduced by the use of termination resistors, either one at each IC which can drive the circuit, or one at each end of the circuit to a terminating voltage.

Such conventional methods and systems have generally been considered satisfactory for their intended purpose. However, there is still a need in the art for improved signal reflection mitigation systems. The present disclosure provides a solution for this need.

SUMMARY

A circuit can include a closed loop bus line having a plurality of connections. The circuit can include a plurality of integrated circuits disposed on the close loop bus line at a respective connection of the plurality of connections. Each of the integrated circuits can be configured to drive a signal on the closed loop bus line. The closed loop bus line can be configured to prevent signal reflection. For example, in certain embodiments, there are no termination resistors at any of the terminations to reduce size, weight, and/or part count of the circuit.

In certain embodiments, the plurality of ICs are disposed in a U-shape. The closed loop bus line can include a closure line connecting ends of the U-shape.

In certain embodiments, the circuit can include a printed circuit board (PCB) having a plurality of layers. The closure line can be disposed within an interior layer of the PCB such that the closure line does not take up additional surface area of the circuit.

The circuit can be an aircraft circuit, for example. Any other suitable application is contemplated herein.

In certain embodiments, an average overshoot voltage and/or undershoot voltage is reduced relative to a circuit without the closed loop bus line. In certain embodiments, average undershoot can be reduced by about 20%.

In accordance with at least one aspect of this disclosure, an aircraft system can include a circuit as disclosed herein, e.g., as described above. Any suitable embodiment of a circuit for the aircraft system is contemplated herein.

In accordance with at least one aspect of this disclosure, a method can include defining a closed loop bus line for a plurality of integrated circuits (ICs) to connect to, directly connecting the one or more ICs to the closed loop bus line without any termination resistors. In certain embodiments, the closed loop bus line and ICs can be configured such that voltage overshoot and voltage undershoot do not exceed thresholds of each IC without termination resistors.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1A:
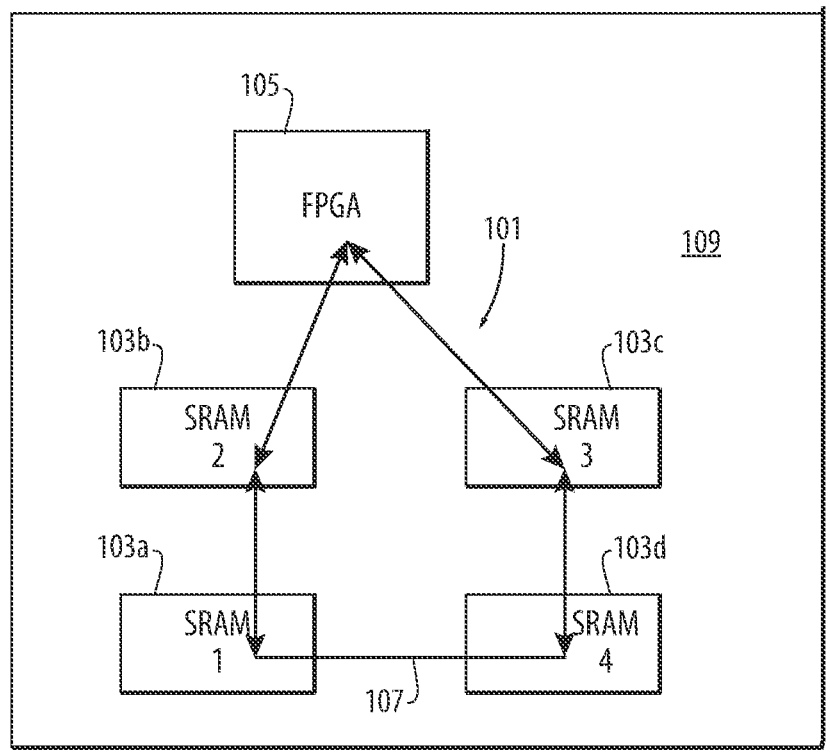
FIG. 1A is a schematic diagram of an embodiment of a circuit in accordance with this disclosure, showing a closed loop bus line.

Reference will now be made to the drawings wherein like reference numerals identify similar structural features or aspects of the subject disclosure. For purposes of explanation and illustration, and not limitation, an illustrative view of an embodiment of a circuit in accordance with the disclosure is shown in FIG. 1A and is designated generally by reference character 100.

Other embodiments and/or aspects of this disclosure are shown in FIGS. 1B-3G. Certain embodiments described herein can be used to reduce the size, complexity, part count, and/or weight of circuits (e.g., for aviation applications).

Figure 1B:
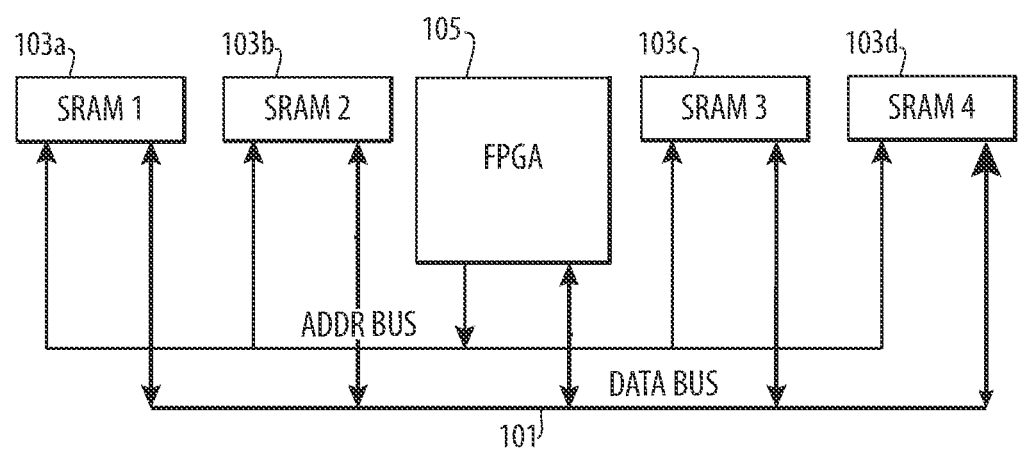
FIG. 1B shows a block diagram of the embodiment of FIG. 1, wherein pullup/pulldown resistors are not shown below (although they are included in the simulations below), wherein source (series) terminations are shown when included on the schematic.

Referring to FIGS. 1A and 1B, a circuit 100 can include a closed loop bus line 101 having a plurality of connections (e.g., points at which one or more circuit components connect to the bus 101). The circuit 100 can include a plurality of integrated circuits (e.g., SRAM_1 103a, SRAM_2 103b, SRAM_3 103c, SRAM_4 103d, and FPGA 105) disposed on the close loop bus line 101 at a respective connection of the plurality of connections. While certain embodiments include five ICs 103a, b, c, d, 105, Any suitable number if ICs are contemplated herein. Each of the integrated circuits 103*a, b, c, d*, 105 can be configured to drive a signal on the closed loop bus line 101. The closed loop bus line 101 can be configured to prevent signal reflection, for example (e.g., as it has no ends). For example, in certain embodiments, there are no termination resistors at any of the terminations to reduce size, weight, and/or part count of the circuit.

In certain embodiments, the plurality of ICs 103*a, b, c, d,* 105 are disposed in a U-shape (e.g., a C-shape or a semi-circular shape). The closed loop bus line 101 can include a closure line 107 connecting ends of the U-shape (e.g., as shown in FIG. 1A).

In certain embodiments, the circuit 100 can include a printed circuit board (PCB) 109 having a plurality of layers (e.g., a multilayer PWB). The closure line 107 can be disposed within an interior layer of the PCB 109 such that the closure line 107 does not take up additional surface area of the circuit 100.

In certain embodiments, the circuit 100 can be an aircraft circuit, for example (e.g., for any suitable aircraft system, component, or weapon). Any other suitable application is contemplated herein.

In certain embodiments, an average overshoot voltage and/or undershoot voltage is reduced relative to a circuit without the closed loop bus line 101. In certain embodiments, average undershoot can be reduced by about 20%.

In accordance with at least one aspect of this disclosure, an aircraft system (not shown) can include a circuit 100 as disclosed herein, e.g., as described above. Any suitable embodiment of a circuit for the aircraft system is contemplated herein.

In accordance with at least one aspect of this disclosure, a method can include defining a closed loop bus line 101 for a plurality of integrated circuits (ICs) 103*a, b, c, d,* 105 to connect to, directly connecting the one or more ICs 103*a, b, c, d,* 105 to the closed loop bus line without any termination resistors. In certain embodiments, the closed loop bus line and ICs can be configured such that voltage overshoot and voltage undershoot do not exceed thresholds of each IC 103*a, b, c, d,* 105 without termination resistors.

Figure 2A:
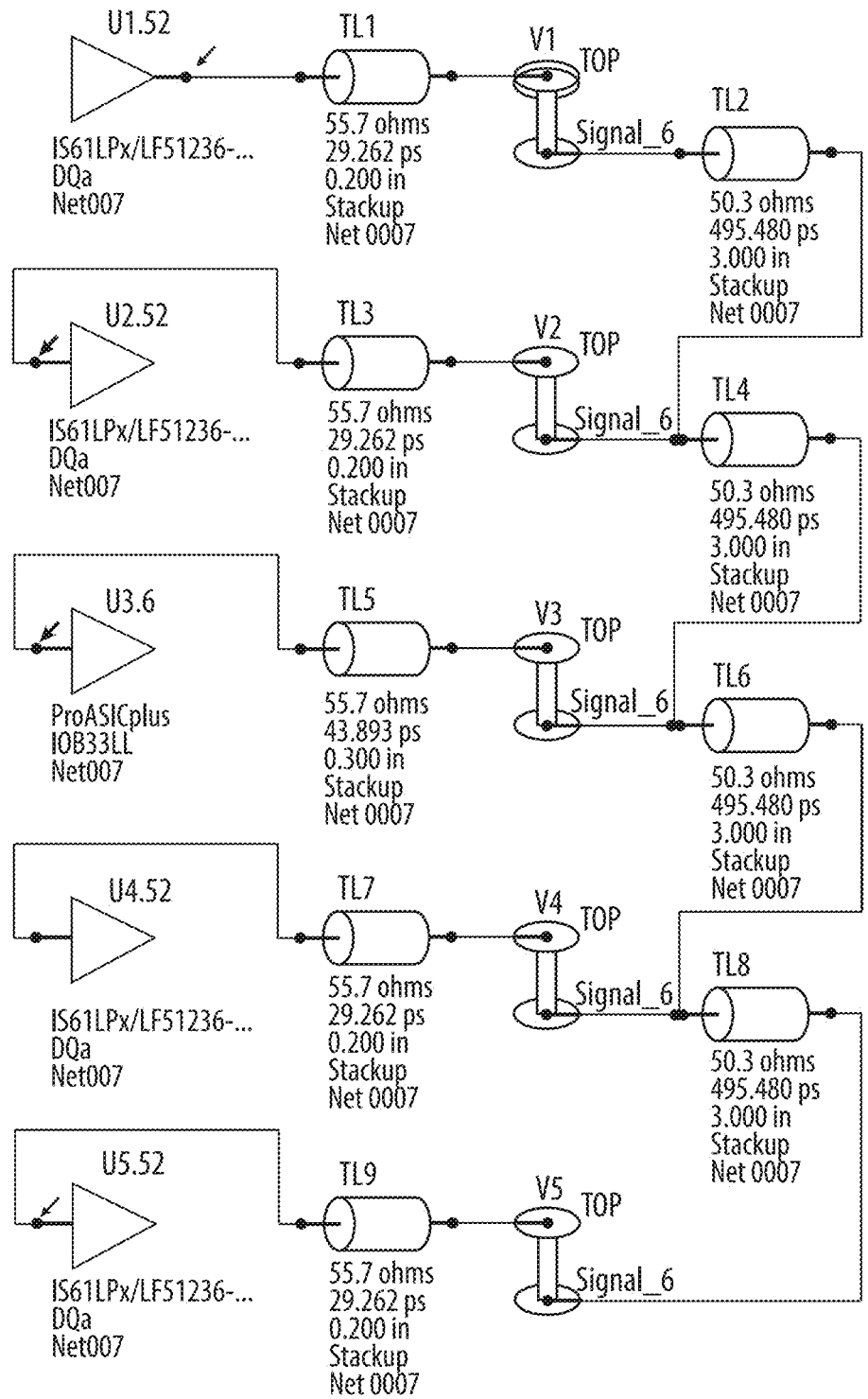
FIG. 2A shows an embodiment of a simulated circuit without termination resistors and without a closed loop bus line.
Figure 3A:
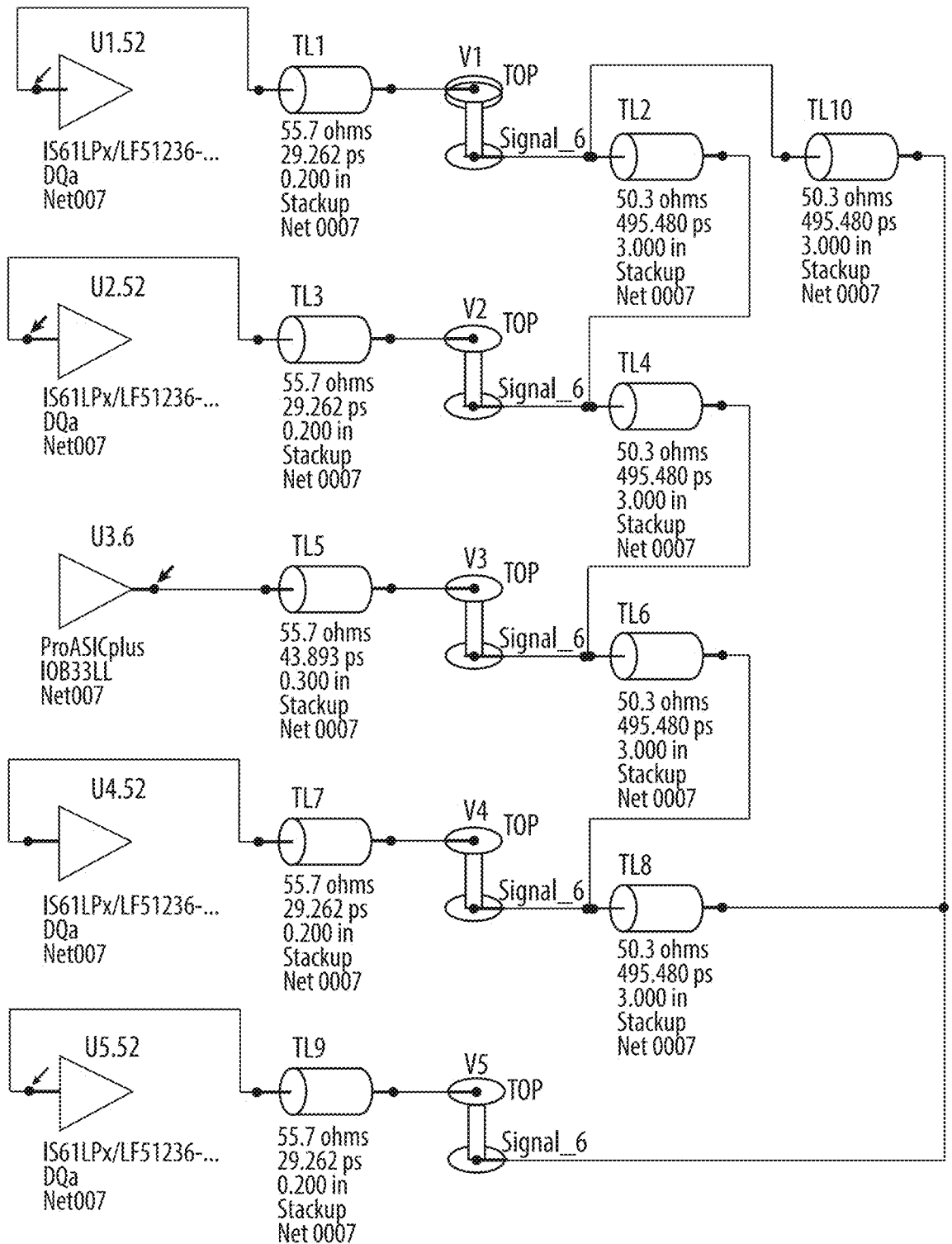
FIG. 3A shows an embodiment of a simulated circuit without termination resistors and with a closed loop bus line in accordance with the Embodiment of FIG. 1.

Example comparison data is presented below between an embodiment of this disclosure and a similar embodiment without a closed loop bus line 101. FIG. 2A shows an embodiment of a simulated circuit without termination resistors and without a closed loop bus line. FIG. 3A shows an embodiment of a simulated circuit without termination resistors and with a closed loop bus line in accordance with the Embodiment of FIG. 1. An example PWB/PCB stack up is shown below in Table 1.

TABLE 1

| Layer | Name | Usage | Thickness (mils) | Er | Loss Tangent |
|---|---|---|---|---|---|
| | | Solder Mask | 0.5 | 3.3 | 0.02 |
| 1 | Top | Signal | 0.675 | | |
| | | Prepreg | 5 | 3.8 | 0.002 |
| 2 | GND_2 | Plane | 1.35 | | |
| | | Core | 5 | 3.8 | 0.002 |
| 3 | Sig_3 | Signal | 0.675 | | |
| | | Prepreg | 5 | 3.8 | 0.002 |
| 4 | GND_4 | Plane | 1.35 | | |
| | | Core | 25 | 3.8 | 0.002 |
| 5 | GND_5 | Plane | 1.35 | | |
| | | Prepreg | 5 | 3.8 | 0.002 |
| 6 | Sig_6 | Signal | 0.675 | | |
| | | Core | 5 | 2.4 | 0.002 |
| 7 | GND_7 | Plane | 1.35 | | |
| | | Prepreg | 5 | 3.8 | 0.002 |
| 8 | Bottom | Signal | 0.675 | | |
| | | Solder Mask | 0.5 | 3.3 | 0.02 |
| Overall Board Thickness | | | 0.0641 +/−10% | | |

Example device characteristics are shown below in Table 2.

TABLE 2

| Device DC Parameters | | $V_{IL}$ [V] | | $V_{IH}$ [V] | | Absolute Max Ratings | | |
|---|---|---|---|---|---|---|---|---|
| | | | | | | Min | Max | |
| Mfg. P/N | Type | Min | Max | Min | Max | [V] | [V] | Notes |
| SRAM | Input | −0.3 | 0.8 | 2.0 | Vdd + 0.3 | −0.3 −0.7 | Vdd + 0.3 4.6 | Vdd = 3.3 V Transient(1) |
| FPGA | 3.3 V Input | −0.3 | 0.8 | 2.0 | Vddp + 0.3 | −0.3 −1.0 | Vddp + 0.3 Vddp + 1.0 | Vddp = 3.3 V Transient(2) |

It is noted that the devices are not to exceed 10% of duty cycle, and are less than $T_{KC}/2$ and $I_{IN}<20$ mA (10 ns for $T_{KC}=50$ MHz operation).

Circuit topology and measurement criteria are described below and shown in FIGS. 1, 2A, and 3A. In the embodiments shown, the topology is symmetric about the FPGA, thus when SRAM_1 drives the bus, the signals at SRAM_3 and SRAM_4 are the same as the signals at SRAM_2 and SRAM_1 (respectively) when SRAM_4 drives the bus. Similarly, SRAM_2 and SRAM_3 are symmetric. Thus, data is not recorded for SRAM_3 and SRAM_4 driving the bus in either topology.

For all single-ended waveforms, unless otherwise noted, prop delay is measured from the first time the driver waveform crosses VIL for a rising edge (or VIH for a falling edge) until the last time the receiver waveform crosses VIH for rising edge (or VIL for a falling edge). The longer of the two times is recorded in the table. This includes both the copper (trace) delay and the settling time required for the signal to be valid at the receiver.

For all single-ended waveforms, unless otherwise noted, Monotonicity criteria is between VIL and VIH only (i.e., within the input switching region), and is only a signal quality pass/fail criteria for clocks and other edge-sensitive signals. Ringing or other aberrations which are exclusively above VIH, or exclusively below VIL, are acceptable, unless it exceeds the absolute max input voltage.

Unless otherwise noted below, the waveforms are measured at the die. The dashed horizontal lines are VIL(max) and VIH(min) of the receiver as defined in the *IBIS* file. Waveform colors are noted in the Tables. Over/undershoot values which exceed the static limits shown above are shown in gold in the following simulation result tables, while values which exceed the transient time or voltage limits are shown in red.

In the embodiments shown in FIGS. 2A and 3A, data signals can be driven or received by any of the four SRAMs or the FPGA. This is routed as a linear network, with two SRAMs on either side of the FPGA. There are no termination resistors of any kind. Net DSP_DATA<0> is 13.1 inches long. For this data, the critical signals are data driven or received by any of the FPGA or four SRAM. For pre-route simulation, all bits of a group (address bus or data bus, for example) are assumed to be the same length, estimated at the longest probable route. For post-5 route simulation, the actual longest and shortest bits are simulated.

Figure 2B:
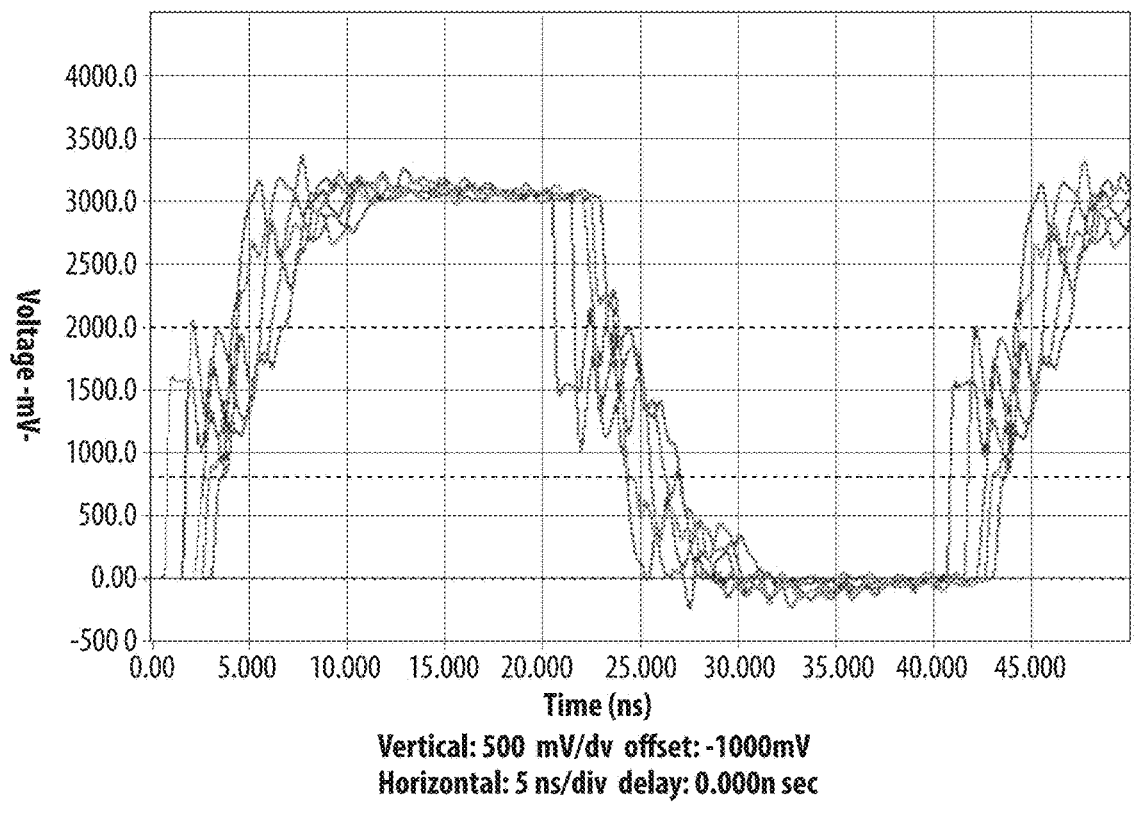
FIGS. 2B, 2C, and 2D show the SRAM_1 driving, waveform—slow/weak (FIG. 2B), waveform—typical (FIG. 2C), and waveform—fast/strong (FIG. 2D)
Figure 2C:
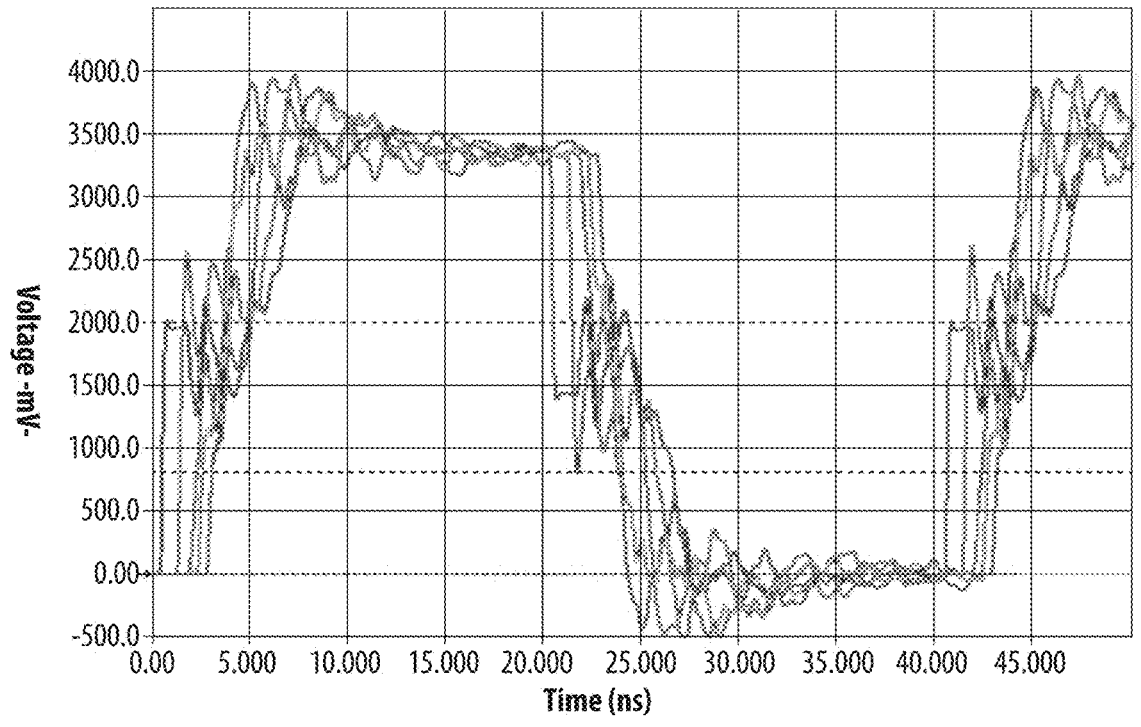
Figure 2D:
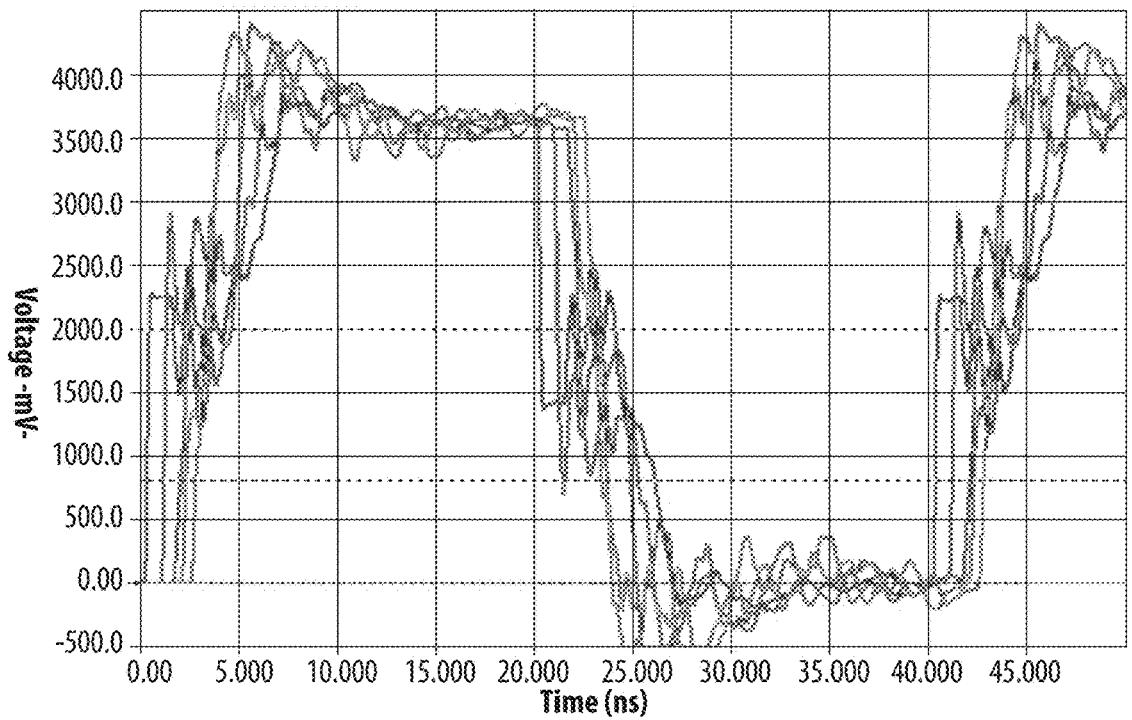

FIGS. 2B, 2C, and 2D show the SRAM_1 driving, waveform—slow/weak (FIG. 2B), waveform—typical (FIG. 2C), and waveform—fast/strong (FIG. 2D). Simulation results are shown below in Table 3.

TABLE 3

| Receiver (color) | FTS Mode | Monotonic | Overshoot High [V] | Overshoot Low [mV] | Prop Delay [ns] |
|---|---|---|---|---|---|
| SRAM_2 | Slow | N | 3.36 | −255.4 | 5.53 |
| U2-52 | Typical | N | 3.95 | −618.8 | 5.10 |
| (green) | Fast | N | 4.27 | −680.9 | 4.76 |
| FPGA | Slow | N | 3.19 | −164.7 | 5.19 |
| U3-6 | Typical | N | 3.92 | −481.3 | 4.42 |
| (cyan) | Fast | N | 4.41 | −666.4 | 4.59 |
| SRAM_3 | Slow | Y | 3.21 | −198.2 | 4.17 |
| U4-52 | Typical | Y | 3.82 | −466.6 | 3.40 |
| (yellow) | Fast | Y | 4.21 | −668.6 | 3.32 |
| SRAM_4 | Slow | N | 3.25 | −240.7 | 6.46 |
| U5-52 | Typical | Y | 3.89 | −527.2 | 3.40 |
| (orange) | Fast | Y | 4.35 | −663.3 | 2.98 |

It is noted that there is significant over/undershoot, but within the transient limits. Undershoot in several locations approaches the limit of −700 mV, however.

Figure 2E:
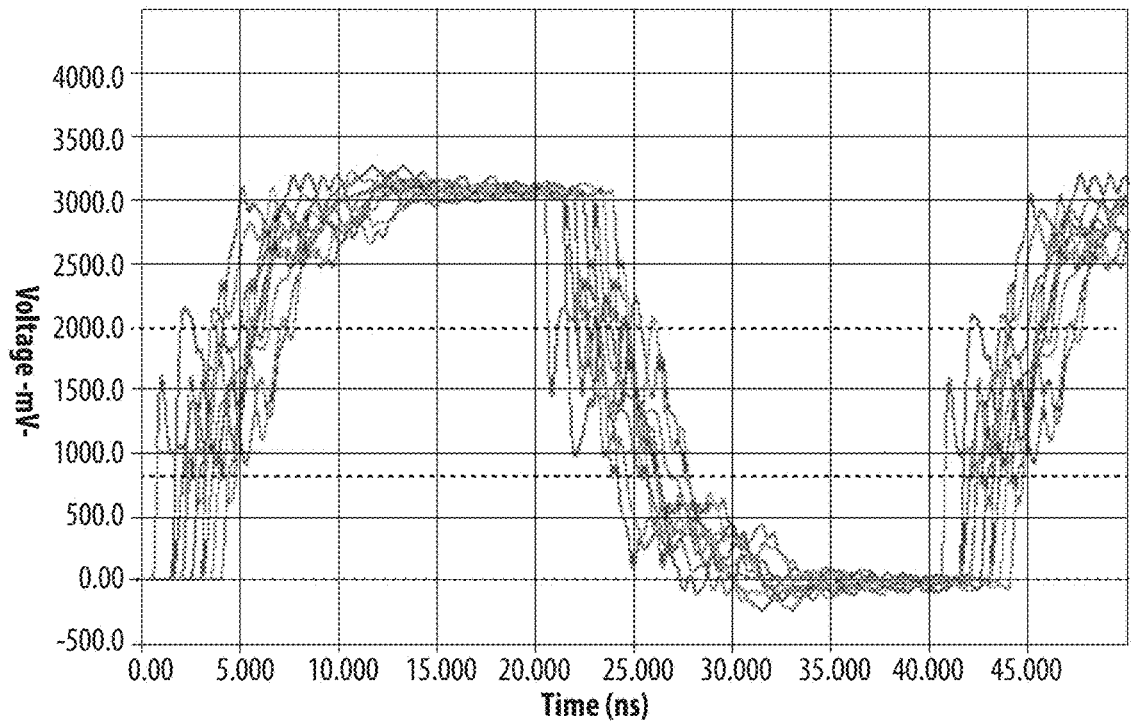
FIGS. 2E, 2F, and 2G show the SRAM_2 driving, waveform—slow/weak (FIG. 2E), waveform—typical (FIG. 2F), and waveform—fast/strong (FIG. 2G)
Figure 2F:
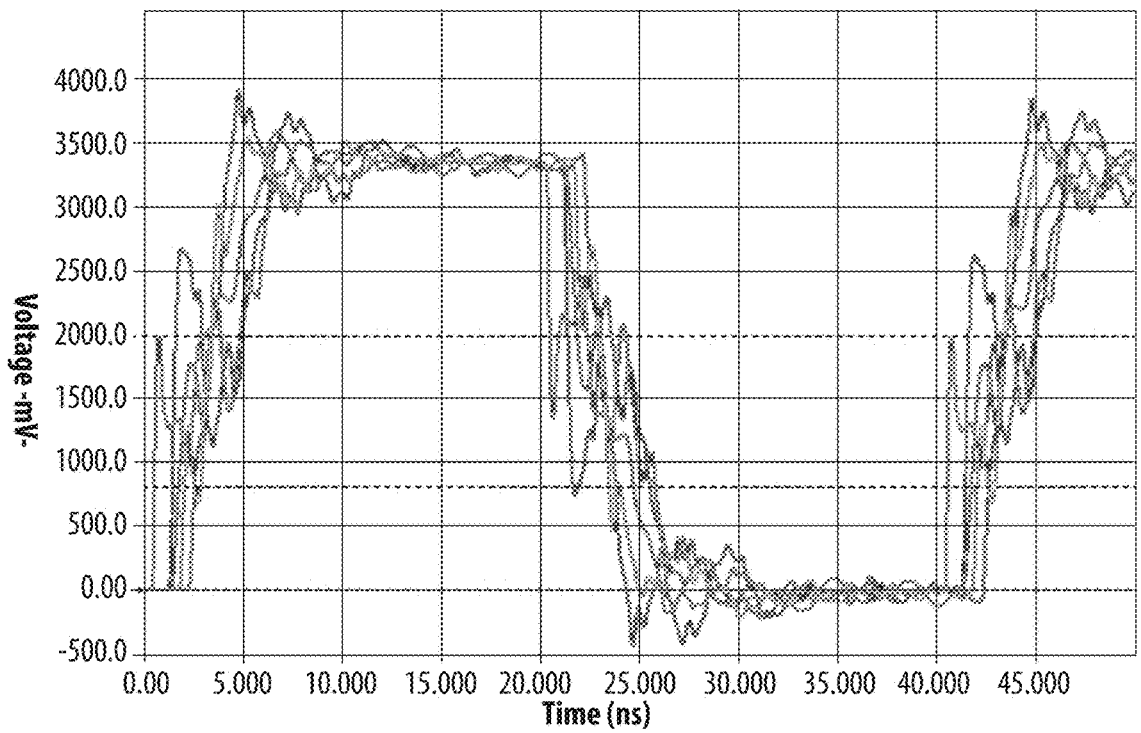
Figure 2G:
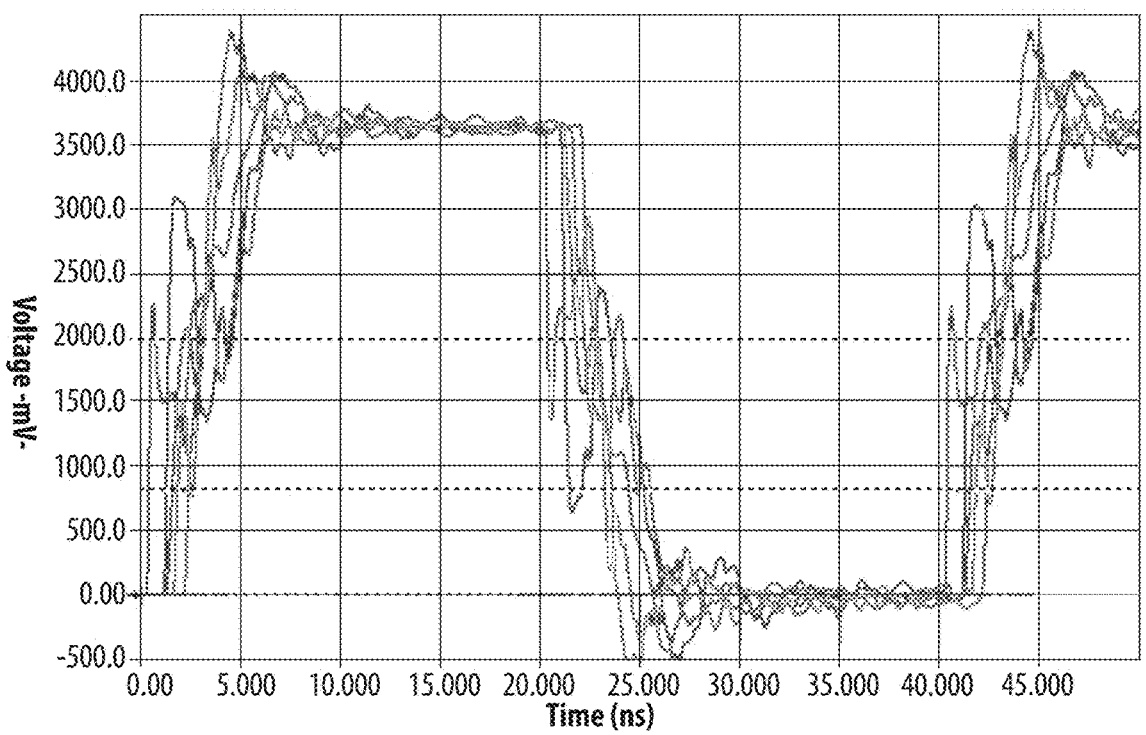

FIGS. 2E, 2F, and 2G show the SRAM_2 driving, waveform—slow/weak (FIG. 2E), waveform—typical (FIG. 2F), and waveform—fast/strong (FIG. 2G). Simulation results are shown below in Table 4.

TABLE 4

| Receiver (color) | FTS Mode | Monotonic | Overshoot High [V] | Overshoot Low [mV] | Prop Delay [ns] |
|---|---|---|---|---|---|
| SRAM_1 | Slow | N | 3.21 | −163.6 | 5.44 |
| U1-52 | Typical | N | 3.75 | −420.2 | 5.10 |
| (red) | Fast | N | 4.08 | −510.4 | 5.10 |
| FPGA | Slow | N | 3.15 | −143.0 | 5.02 |
| U3-6 | Typical | N | 3.60 | −173.4 | 4.25 |
| (cyan) | Fast | N | 4.04 | −439.1 | 4.17 |
| SRAM_3 | Slow | N | 3.22 | −173.7 | 4.08 |
| U4-52 | Typical | N | 3.55 | −223.0 | 3.66 |
| (yellow) | Fast | N | 4.15 | −370.5 | 2.81 |
| SRAM_4 | Slow | Y | 3.25 | −251.5 | 3.74 |
| U5-52 | Typical | Y | 3.92 | −435.7 | 3.32 |
| (orange) | Fast | Y | 4.40 | −739.2 | 3.15 |

There is significant over/undershoot. While most of it is within the transient limits, the undershoot at SRAM_4 (U5) exceeds the transient limit of −700 mV. (e.g., due to symmetry, the same problem would occur at SRAM_1 (U1) when SRAM_3 (U2) is the driver). This issue traditionally requires some kind of termination resistor to resolve.

Figure 2H:
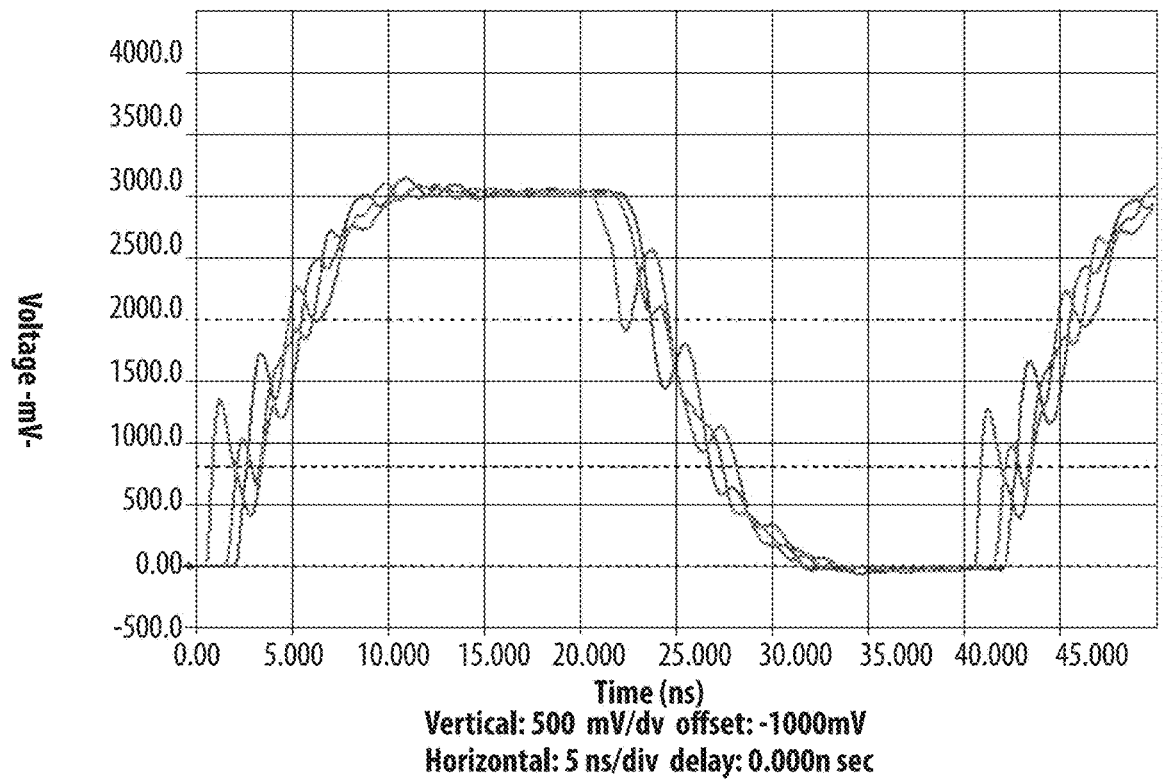
FIGS. 2H, 2I, and 2J show the FPGA driving, waveform—slow/weak (FIG. 2H), waveform—typical (FIG. 2I), and waveform—fast/strong (FIG. 2J)
Figure 2I:
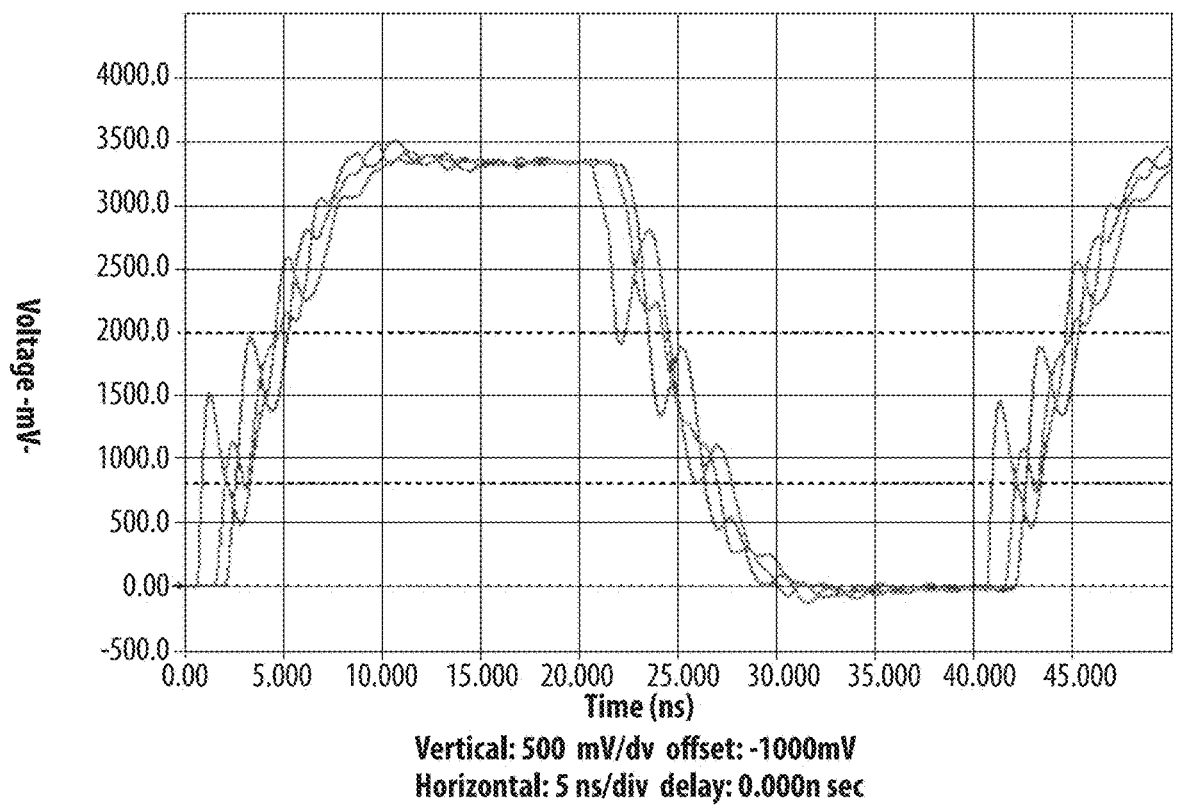
Figure 2J:
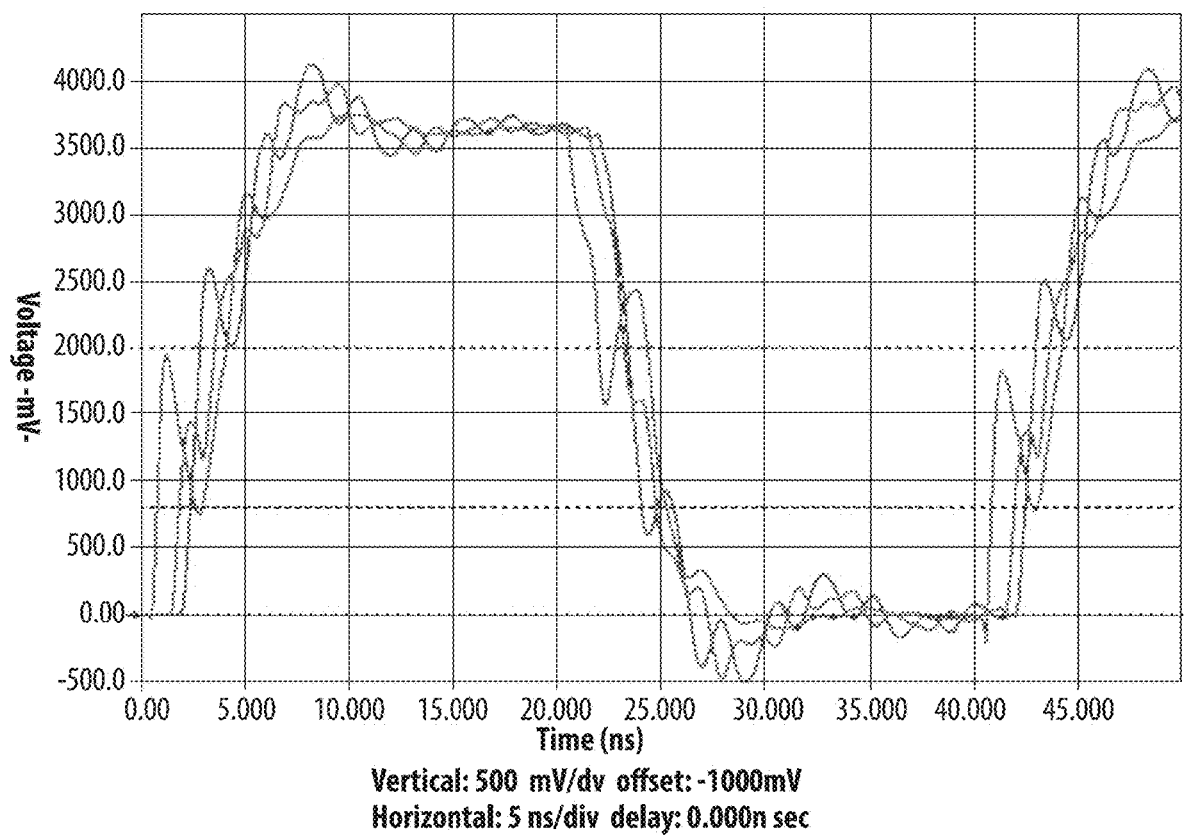

FIGS. 2H, 2I, and 2J show the FPGA driving, waveform—slow/weak (FIG. 2H), waveform—typical (FIG. 2I), and waveform—fast/strong (FIG. 2J). Simulation results are shown in Table 5 below.

TABLE 5

| Receiver (color) | FTS Mode | Monotonic | Overshoot High [V] | Overshoot Low [mV] | Prop Delay [ns] |
|---|---|---|---|---|---|
| SRAM_1 | Slow | N | 3.14 | −64.96 | 4.68 |
| U1-52 | Typical | N | 3.50 | −128.0 | 4.51 |
| (red) | Fast | N | 4.11 | −511.7 | 3.64 |
| SRAM_2 | Slow | N | 3.10 | −56.20 | 5.19 |
| U2-52 | Typical | N | 3.49 | −85.54 | 5.44 |
| (green) | Fast | N | 3.97 | −482.4 | 2.79 |
| SRAM_3 | Slow | N | 3.10 | −56.20 | 5.19 |
| U4-52 | Typical | N | 3.49 | −85.54 | 5.44 |
| (yellow) | Fast | N | 3.97 | −482.4 | 2.79 |
| SRAM_4 | Slow | N | 3.14 | −64.96 | 4.68 |
| U5-52 | Typical | N | 3.50 | −128.0 | 4.51 |
| (orange) | Fast | N | 4.11 | −511.7 | 3.64 |

As shown, there is significant over/undershoot, but within the transient limits.

The embodiments of FIG. 3A (e.g., the circuit of FIG. 1A) is simulated below having loop routing (e.g., a close loop bus). The signals can be driven or received by any of the four SRAMs or the FPGA. However, this is now routed as a loop, by adding a segment from SRAM_1 to SRAM_4. There are no termination resistors of any kind. Net DSP_DATA<0> is 16.1 inches long as tested.

Figure 3B:
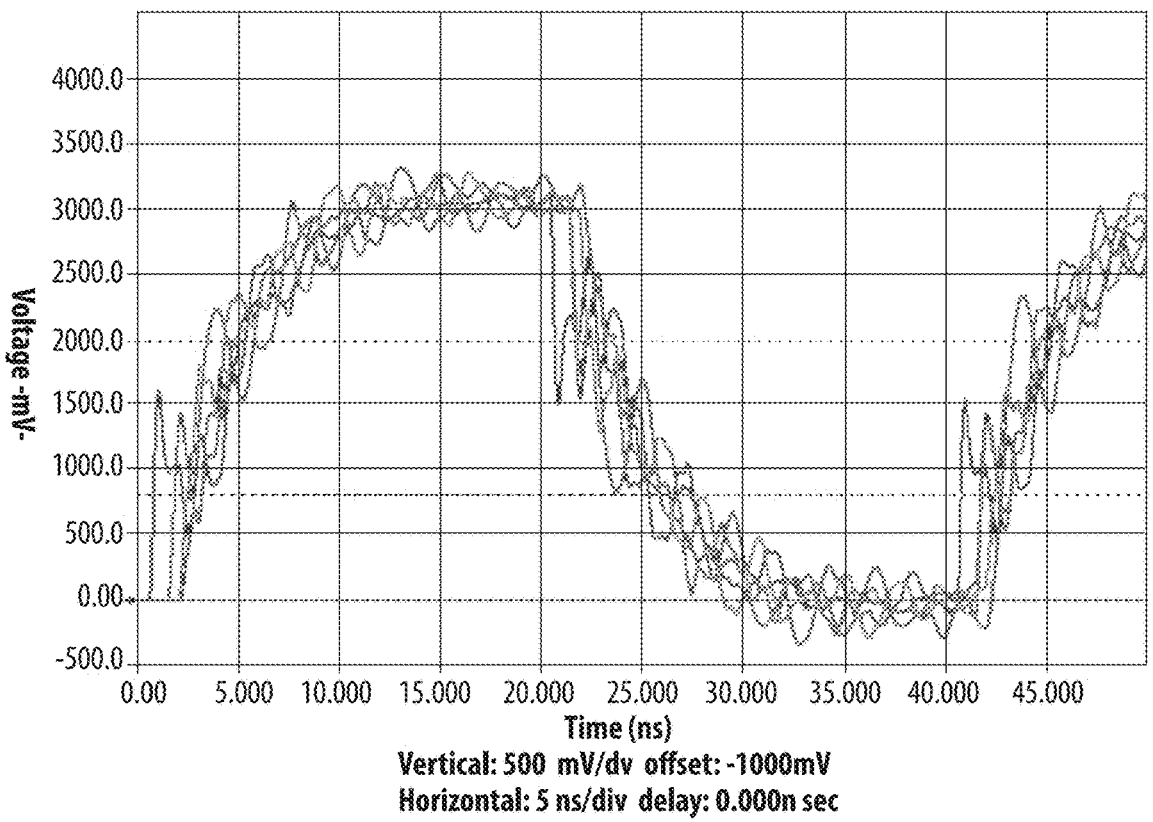
FIGS. 3B, 3C, and 3D show the SRAM_1 driving, waveform—slow/weak (FIG. 3B), waveform—typical (FIG. 3C), and waveform—fast/strong (FIG. 3D)
Figure 3C:
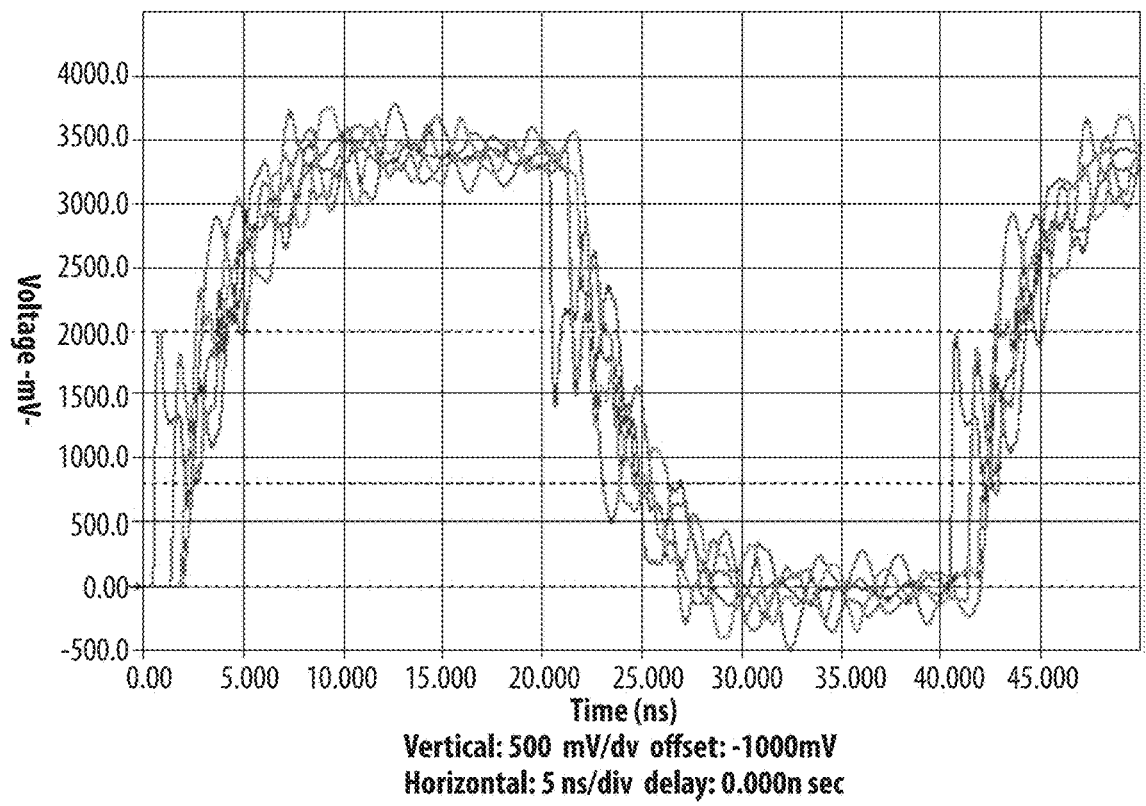
Figure 3D:
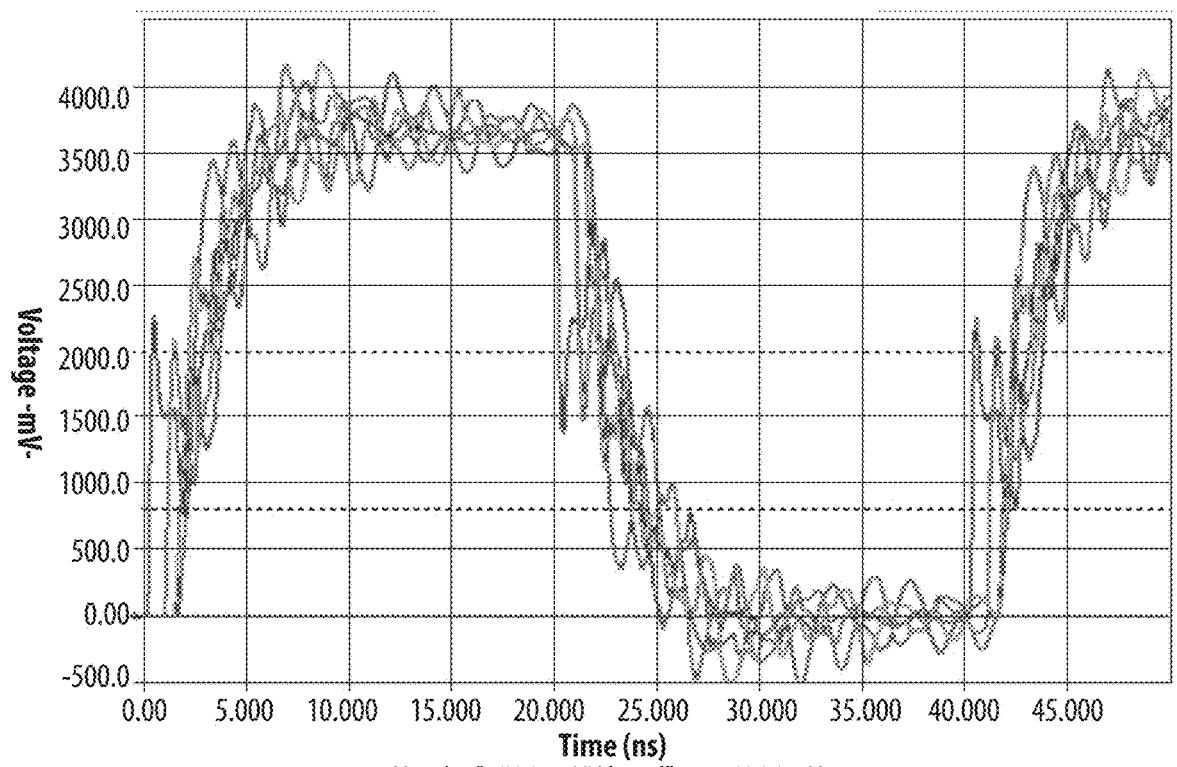

FIGS. 3B, 3C, and 3D show the SRAM_1 driving, waveform—slow/weak (FIG. 3B), waveform—typical (FIG. 3C), and waveform—fast/strong (FIG. 3D). Simulation results are shown below in Table 6.

TABLE 6

| Receiver (color) | FTS Mode | Monotonic | Overshoot High [V] | Overshoot Low [mV] | Prop Delay [ns] |
|---|---|---|---|---|---|
| SRAM_2 | Slow | N | 3.27 | −261.0 | 5.95 |
| U2-52 | Typical | N | 3.72 | −292.6 | 5.87 |
| (green) | Fast | N | 4.17 | −491.3 | 5.78 |
| FPGA | Slow | N | 3.27 | −269.1 | 5.19 |
| U3-6 | Typical | N | 3.66 | −360.7 | 4.85 |
| (cyan) | Fast | N | 4.04 | −401.2 | 4.76 |
| SRAM_3 | Slow | N | 3.29 | −289.6 | 5.61 |
| U4-52 | Typical | N | 3.74 | −397.7 | 4.85 |
| (yellow) | Fast | N | 4.18 | −614.5 | 4.76 |
| SRAM_4 | Slow | N | 3.32 | −339.9 | 6.72 |
| U5-52 | Typical | N | 3.77 | −497.0 | 4.42 |
| (orange) | Fast | N | 4.10 | −516.5 | 4.17 |

As shown, there is significant over/undershoot, but within the transient limits.

Figure 3E:
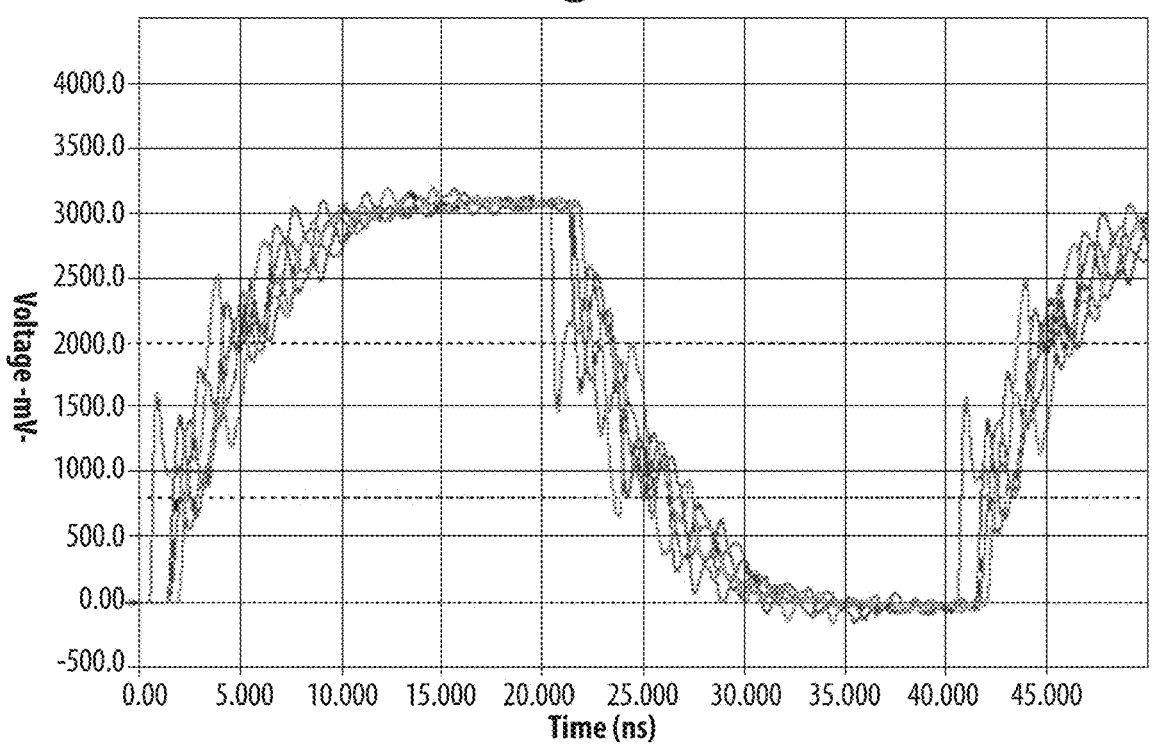
FIGS. 3E, 3F, and 3G show the SRAM_2 driving, waveform—slow/weak (FIG. 3E), waveform—typical (FIG. 3F), and waveform—fast/strong (FIG. 3G)
Figure 3F:
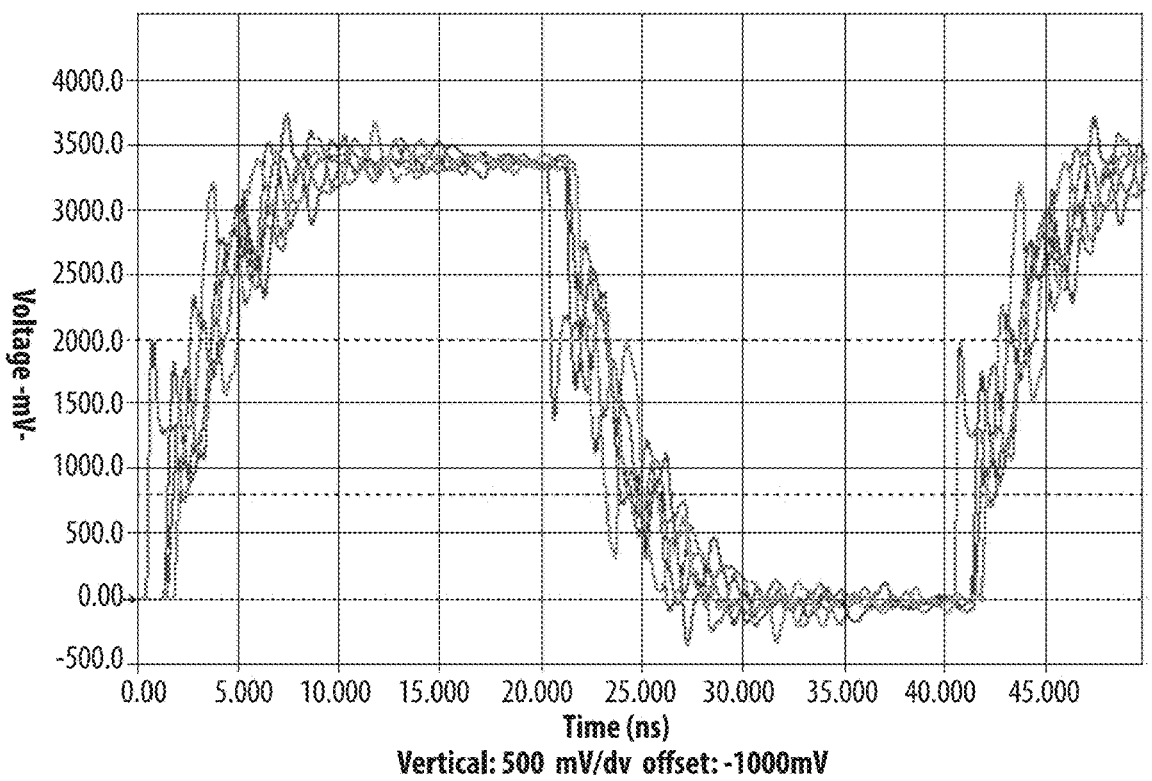
Figure 3G:
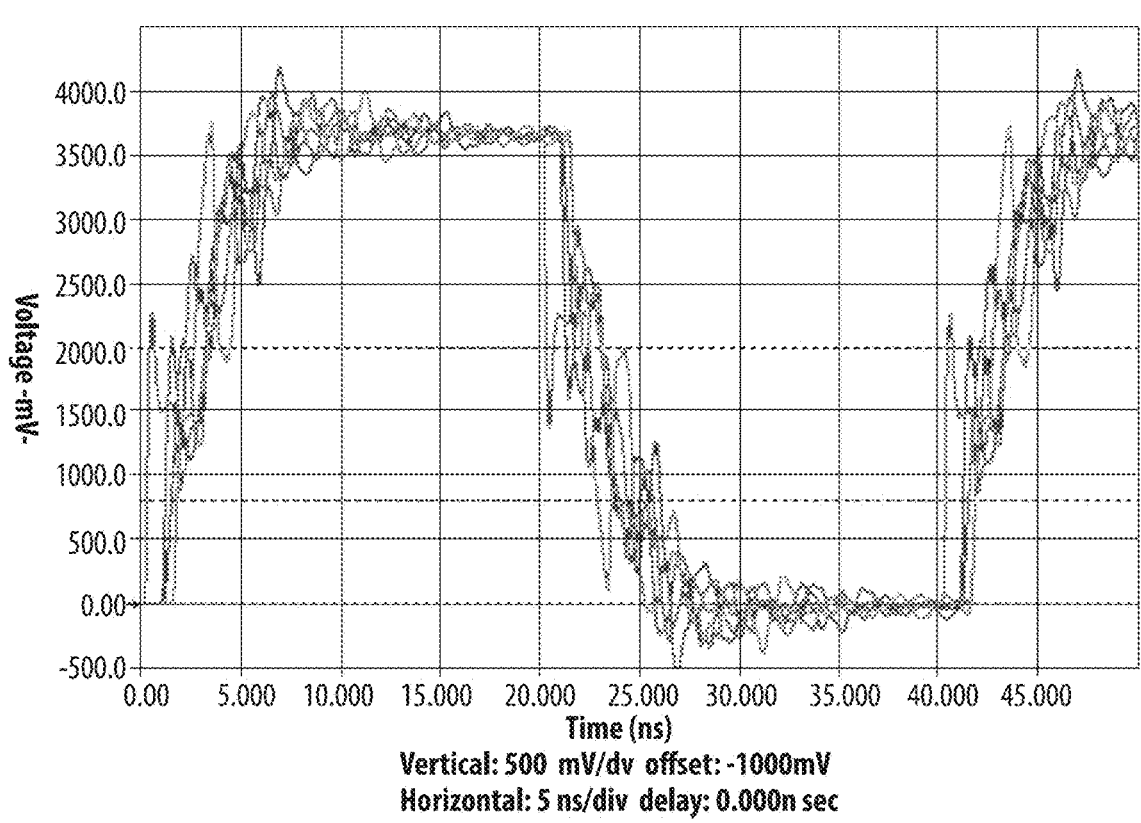

FIGS. 3E, 3F, and 3G show the SRAM_2 driving, waveform—slow/weak (FIG. 3E), waveform—typical (FIG. 3F), and waveform—fast/strong (FIG. 3G). Simulation results are shown below in Table 7.

TABLE 7

| Receiver (color) | FTS Mode | Monotonic | Overshoot High [V] | Overshoot Low [mV] | Prop Delay [ns] |
|---|---|---|---|---|---|
| SRAM_1 | Slow | N | 3.16 | −129.6 | 6.29 |
| U1-52 | Typical | N | 3.73 | −359.5 | 5.95 |
| (red) | Fast | N | 4.18 | −555.3 | 5.78 |
| FPGA | Slow | N | 3.16 | −111.5 | 5.87 |
| U3-6 | Typical | N | 3.54 | −215.4 | 5.61 |
| (cyan) | Fast | N | 3.97 | −290.5 | 5.36 |
| SRAM_3 | Slow | N | 3.20 | −167.4 | 7.06 |
| U4-52 | Typical | N | 3.67 | −335.4 | 4.34 |
| (yellow) | Fast | N | 3.99 | −388.9 | 4.34 |
| SRAM_4 | Slow | N | 3.18 | −156.7 | 5.78 |
| U5-52 | Typical | N | 3.60 | −254.3 | 5.19 |
| (orange) | Fast | N | 3.97 | −342.9 | 5.02 |

There is significant over/undershoot, but within the transient limits. This is the condition (without circular routing) that failed undershoot limit of −700 mV at U5. It is now less than half of that value. This is an unexpected result that proves termination resistors can be avoided with a closed loop bus for the same circuit component arrangement.

Figure 3H:
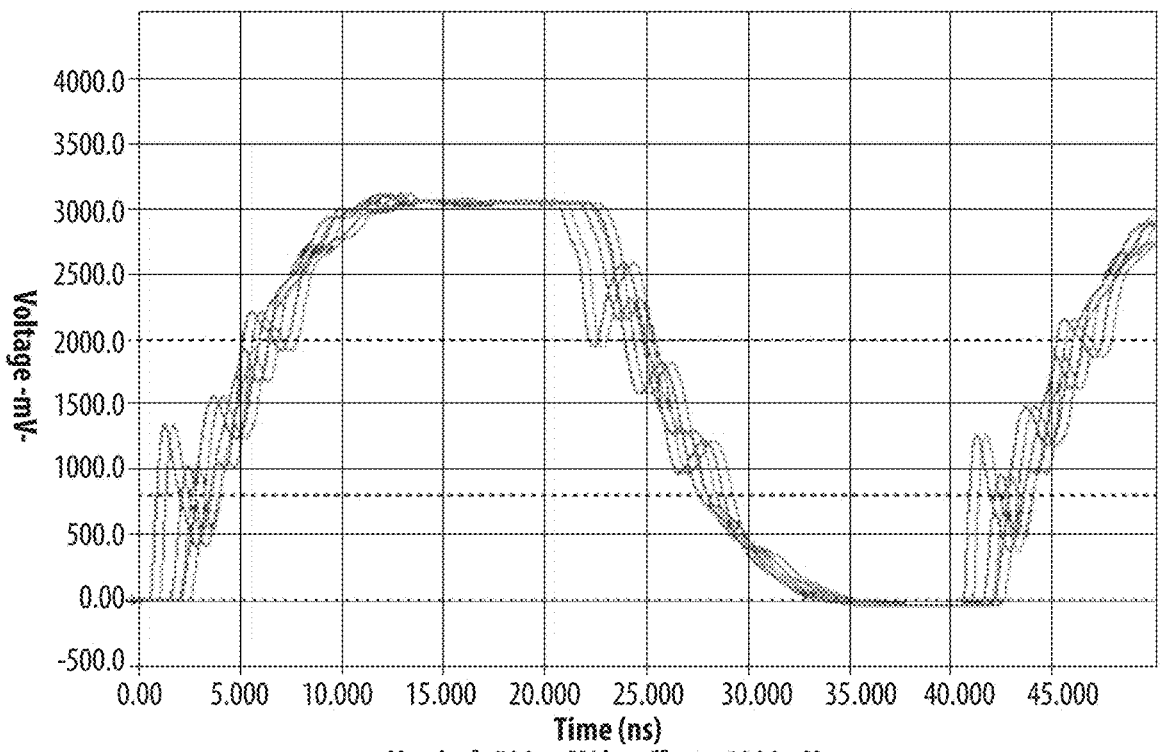
FIGS. 3H, 3I, and 3J show the FPGA driving, waveform—slow/weak (FIG. 3H), waveform—typical (FIG. 3I), and waveform—fast/strong (FIG. 3J).
Figure 3I:
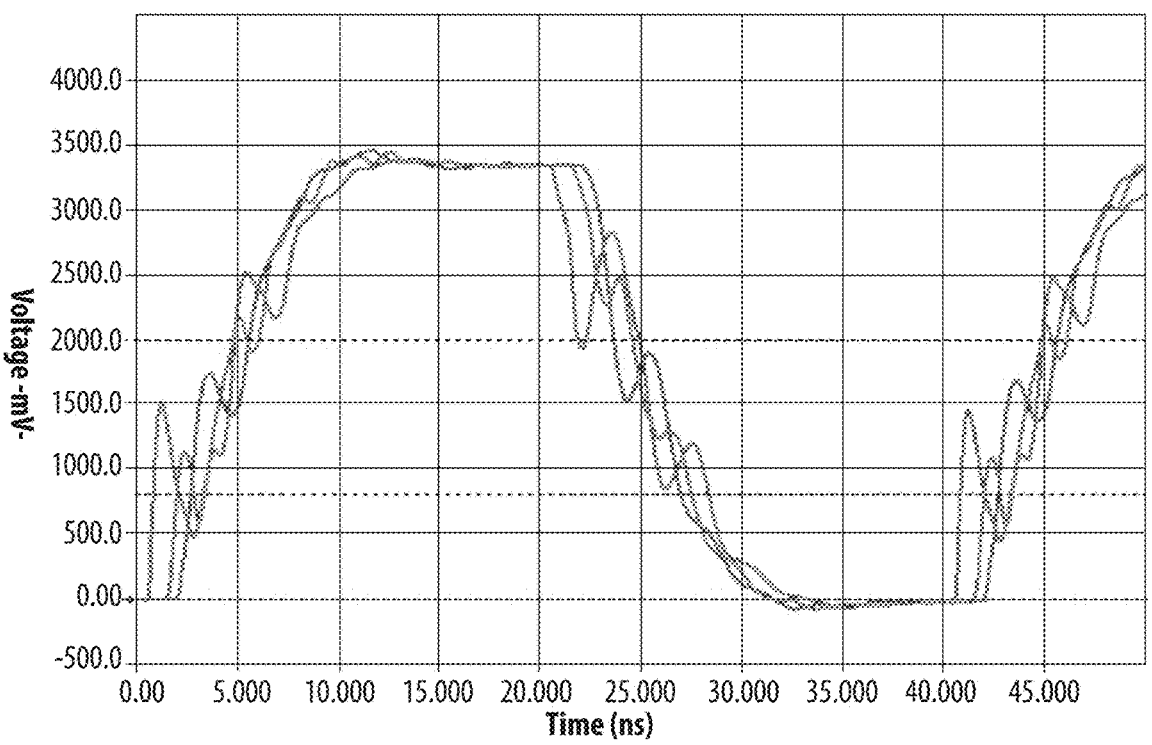
Figure 3J:
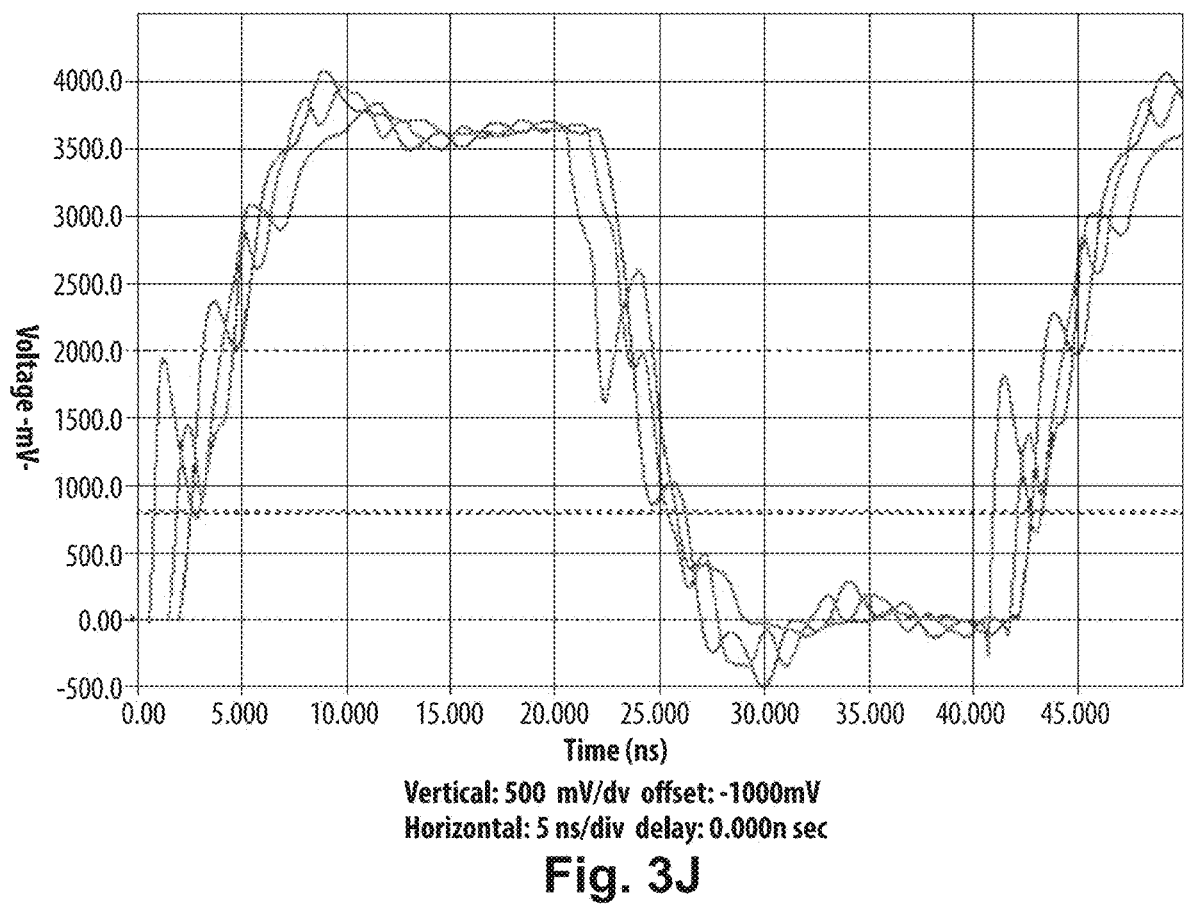

FIGS. 3H, 3I, and 3J show the FPGA driving, waveform—slow/weak (FIG. 3H), waveform—typical (FIG. 3I), and waveform—fast/strong (FIG. 3J). Simulation results are shown below in Table 8.

TABLE 8

| Receiver (color) | FTS Mode | Monotonic | Overshoot High [V] | Overshoot Low [mV] | Prop Delay [ns] |
|---|---|---|---|---|---|
| SRAM_1 | Slow | N | 3.10 | −41.72 | 5.44 |
| U1-52 | Typical | N | 3.46 | −73.80 | 5.18 |
| (red) | Fast | N | 4.07 | −508.1 | 4.17 |
| SRAM_2 | Slow | N | 3.11 | −44.11 | 5.95 |
| U2-52 | Typical | N | 3.44 | −77.44 | 5.70 |
| (green) | Fast | N | 3.96 | −351.8 | 3.49 |
| SRAM_3 | Slow | N | 3.11 | −44.11 | 5.95 |
| U4-52 | Typical | N | 3.44 | −77.44 | 5.70 |
| (yellow) | Fast | N | 3.96 | −351.8 | 3.49 |
| SRAM_4 | Slow | N | 3.10 | −41.72 | 5.44 |
| U5-52 | Typical | N | 3.46 | −73.80 | 5.18 |
| (orange) | Fast | N | 4.07 | −508.1 | 4.17 |

There is significant over/undershoot, but within the transient limits. Thus, as shown in the tables above, there is not excessive overshoot/undershoot with embodiments of this disclosure without termination resistors, whereas there is unacceptable overshoot/undershoot without the closed loop bus, e.g., due to signal reflection at the ends of the bus. This means that traditional systems need termination resistors to prevent excessive voltages. For 32 bit systems, for example, it means there are 64 ends, and therefore 64 resistors would be needed. This is requires significant area, component count, and weight.

Table 9 below summarizes simulation results. This presents the average values (across slow/typical/fast for all receivers) for each driver, by routing method. While individual results varied (in a few cases, the circular route had higher over/undershoot for a specific receiver), the over all result was lower over/undershoot. Undershoot, in particular, was reduced by about 20% on average.

TABLE 9

| | Traditional Circuit Routing of FIG. 2A | | | Circular Routing of FIG. 3A | | |
|---|---|---|---|---|---|---|
| Driver | Overshoot High [V] | Overshoot Low [mV] | Prop Delay [ns] | Overshoot High [V] | Overshoot Low [mV] | Prop Delay [ns] |
| SRAM_1 | 3.82 | −469 | 4.44 | 3.71 | −394 | 5.24 |
| SRAM_2 | 3.69 | −337 | 4.15 | 3.61 | −276 | 5.55 |
| FPGA | 3.55 | −221 | 4.38 | 3.52 | −183 | 4.99 |

In summary, the simulation data shows the signal integrity of a proposed data bus bit, routed in two different ways. The first is a traditional routing method, with the master FPGA in the middle of a linear bus, with two SRAMs on each side of the FPGA. This bus is unterminated. All five devices are capable of driving the data bus. The second routing eliminates the positive reflections from each end of the bus, by completing the routing between the ends, forming (approximately) a circle. This allows all devices to see approximately the same loading and reflections, and reduces over/undershoot.

It has been shown that a circular routing can reduce peak over/undershoot by 50% and eliminates the need for termination resistors. This can be especially important on wide address or data busses, for example, a 32-bit data bus would require a total of 64 resistors to terminate both ends of the bus. This represents a non-trivial board area, even if the component cost and placement/testing cost is acceptable. Source-termination is the gold standard for signal integrity, but in certain applications, it would require 5 resistors for each data bit, or 160 resistors for a 32-bit bus with five drivers on each bit.

Embodiments can be especially beneficial in systems where physical ends of an existing bus design are in close proximity, e.g., where the topology forms a "C" or "U" shape as trace length added is minimized. Embodiments can be a useful tool to be considered in circuit design, especially for a data bus or other multi-driver net where source termination is impractical, and end-termination is undesirable.

When the physical ends of a circuit are in close proximity, the ends of the circuit can be connected together to form a closed loop (e.g., approximately a circle). This eliminates the reflection from the ends of the circuit, and reduces the resulting voltage reflections at the IC input. Embodiments allow removal of termination resistors from designs for ICs on a common bus. Embodiments result in a similar effect to system having termination resistors installed at each end of the circuit, but avoid the cost and space required by the resistors. This is especially advantageous when there are a number of similar circuits, such as on a 32-bit wide data bus, which would otherwise require a total of 64 resistors to terminate both ends of 32 circuits. The circuit closure can be made on internal layers of the PWB, at no cost and no component space required.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A circuit, comprising:
   a printed circuit board (PCB) that includes:
      a closed loop data bus line having a first plurality of connections;
      a closed loop address bus line having a second plurality of connections; and
      a plurality of integrated circuits (ICs) each disposed on the closed loop data bus line at a respective connection of the first plurality of connections and on the closed loop address bus line at a respective connection of the second plurality of connections, wherein the plurality of ICs includes (i) a plurality of static random-access memory (SRAM) components configured to drive signals on the closed loop data bus line and the closed loop address bus line and (ii) a field programmable gate array (FPGA), wherein the closed loop data bus line and the closed loop address bus line are configured to prevent signal reflection, and wherein there are no termination resistors at any terminations to reduce size, weight, and/or part count of the circuit.

2. The circuit of claim 1, wherein the ICs are disposed in a U-shape.

3. The circuit of claim 2, wherein each of the closed loop data bus line and the closed loop address bus line includes a closure line connecting ends of the U-shape.

4. The circuit of claim 3, wherein the PCB includes a plurality of layers.

5. The circuit of claim 4, wherein each closure line is disposed within an interior layer of the PCB such that the closure line does not take up additional surface area of the circuit.

6. The circuit of claim 4, wherein the circuit is an aircraft circuit.

7. The circuit of claim 1, wherein an average overshoot voltage and/or undershoot voltage is reduced relative to a circuit without the closed loop data bus line and the closed loop address bus line.

8. The circuit of claim 7, wherein average undershoot is reduced by about 20%.

9. An aircraft system, comprising:
   a circuit having a printed circuit board (PCB) that includes:
      a closed loop data bus line having a first plurality of connections;
      a closed loop address bus line having a second plurality of connections; and
      a plurality of integrated circuits (ICs) each disposed on the closed loop data bus line at a respective connection of the first plurality of connections and on the closed loop address bus line at a respective connection of the second plurality of connections, wherein the plurality of ICs includes (i) a plurality of static random-access memory (SRAM) components configured to drive signals on the closed loop data bus line and the closed loop address bus line and (ii) a field programmable gate array (FPGA), wherein the closed loop data bus line and the closed loop address bus line are configured to prevent signal reflection, and wherein there are no termination resistors at any terminations to reduce size, weight, and/or part count of the circuit.

10. The aircraft system of claim 9, wherein the ICs are disposed in a U-shape.

11. The aircraft system of claim 10, wherein each of the closed loop data bus line and the closed loop address bus line includes a closure line connecting ends of the U-shape.

12. The aircraft system of claim 11, wherein the PCB includes a plurality of layers.

13. The aircraft system of claim 12, wherein each closure line is disposed within an interior layer of the PCB such that the closure line does not take up additional surface area of the circuit.

14. The aircraft system of claim 12, wherein the circuit is an aircraft circuit.

15. The aircraft system of claim 9, wherein an average overshoot voltage and/or undershoot voltage is reduced relative to a circuit without the closed loop data bus line and the closed loop address bus line.

16. The aircraft system of claim 15, wherein average undershoot is reduced by about 20%.

17. A method, comprising:
   defining, on a printed circuit board (PCB), a closed loop data bus line and a closed loop address bus line for a plurality of integrated circuits (ICs) to connect to; and directly connecting the plurality of ICs to the closed loop data bus line and the closed loop address bus line without any termination resistors, wherein the plurality of ICs includes (i) a plurality of static random-access memory (SRAM) components configured to drive signals on the closed loop data bus line and the closed loop address bus line and (ii) a field programmable gate array (FPGA).

18. The method of claim 17, wherein the closed loop data bus line, the closed loop address bus line, and the ICs are configured such that voltage overshoot and voltage undershoot do not exceed thresholds of each IC without termination resistors.

19. The method of claim 17, wherein the ICs are disposed in a U-shape, and each of the closed loop data bus line and the closed loop address bus line includes a closure line connecting ends of the U-shape.

20. The method of claim 19, wherein the PCB includes a plurality of layers, and each closure line is disposed within an interior layer of the PCB.

21. The circuit of claim 5, wherein the FPGA is disposed at a first end of the U-shape, each closure line is disposed at a second end of the U-shape, and identical numbers of the plurality of SRAMs are disposed on a first side and a second side of the U-shape between the first end and the second end.

22. The circuit of claim 13, wherein the FPGA is disposed at a first end of the U-shape, each closure line is disposed at a second end of the U-shape, and identical numbers of the plurality of SRAMs are disposed on a first side and a second side of the U-shape between the first end and the second end.

* * * * *